US009337440B2

(12) United States Patent
Ariyoshi et al.

(10) Patent No.: US 9,337,440 B2
(45) Date of Patent: May 10, 2016

(54) ORGANIC LUMINESCENT DISPLAY DEVICE

(71) Applicant: Japan Display Inc., Tokyo (JP)

(72) Inventors: Tomoyuki Ariyoshi, Tokyo (JP); Naoki Tokuda, Tokyo (JP); Toshihiro Sato, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 14/155,392

(22) Filed: Jan. 15, 2014

(65) Prior Publication Data

US 2014/0197395 A1    Jul. 17, 2014

(30) Foreign Application Priority Data

Jan. 17, 2013  (JP) ................... 2013-006190

(51) Int. Cl.
*H01L 27/32* (2006.01)
*H01L 51/52* (2006.01)

(52) U.S. Cl.
CPC ......... *H01L 51/5218* (2013.01); *H01L 27/3244* (2013.01); *H01L 2251/5315* (2013.01)

(58) Field of Classification Search
CPC .................................................. H01L 27/3246
USPC ............................................................ 257/40
See application file for complete search history.

(56) References Cited

U.S. PATENT DOCUMENTS

| 2005/0001963 | A1* | 1/2005 | Yokoyama ..................... 349/122 |
| 2006/0145159 | A1* | 7/2006 | Yokoyama et al. ............... 257/72 |
| 2007/0131994 | A1* | 6/2007 | Sawasaki ....................... 257/295 |

FOREIGN PATENT DOCUMENTS

JP          2012-22956       2/2012

* cited by examiner

*Primary Examiner* — Tran Tran
(74) *Attorney, Agent, or Firm* — Typha IP LLC

(57) ABSTRACT

An organic luminescent display device according to the invention includes: an element substrate; an organic film; and an organic electro luminescent element formed on the organic film. The organic electro luminescent element includes: an anode formed on the organic film; a light emitting layer formed on the anode; and a cathode formed on the light emitting layer. The anode includes: an adhesion layer formed in contact with an upper surface of the organic film; a reflection layer and formed in contact with an upper surface of the adhesion layer; and a light transmitting contact layer formed on the reflection layer. An edge portion of an outer periphery of the adhesion layer is positioned outside an edge portion of an outer periphery of the reflection layer as viewed in a plan view.

18 Claims, 5 Drawing Sheets

ORGANIC LUMINESCENT DISPLAY DEVICE

CROSS-REFERENCE TO RELATED APPLICATION

The present application claims priority from Japanese application JP 2013-6190 filed on Jan. 17, 2013, the content of which is hereby incorporated by reference into this application.

BACKGROUND OF THE INVENTION

1. Field of the Invention

The present invention relates to an organic luminescent display device.

2. Description of the Related Art

As a thin and light-weighted light emitting source, an organic light emitting diode, that is, an organic electro luminescent element has been attracting attentions, and there has been developed an image display device which includes a large number of organic electro luminescent elements. The organic electro luminescent element has the structure where at least one organic thin film formed using an organic material is sandwiched between a pixel electrode and a counter electrode. Recently, an organic luminescent display device having such an organic electro luminescent element is requested to satisfy a demand for higher definition and higher brightness of pixels, and the prolongation of a product lifetime.

With respect to an organic luminescent display device having an organic electro luminescent element, for example, there has been disclosed the constitution which includes a transistor formed on an element substrate, a leveling film formed on the transistor and formed of an organic film, and an organic electro luminescent element having a lower electrode, an organic layer and an upper electrode which are formed on the leveling film. JP 2012-022956 A discloses the constitution which includes a bank formed of an insulation film, an auxiliary electrode formed on the bank, and an adhesion layer containing molybdenum and chromium which is formed between the bank and the auxiliary electrode. Further, there have been also known a method where lower electrodes are formed by dry etching with high definition and a method where a reflection layer made of silver is formed for realizing high brightness.

SUMMARY OF THE INVENTION

Silver exhibits low adhesiveness with an organic film (leveling film) compared to aluminum or the like and hence, silver is liable to be peeled off from the leveling film. Further, when an adhesion layer containing molybdenum or chromium is formed between a leveling film and a reflection layer made of silver, since an anode is formed by dry etching, an edge portion of an outer periphery of the adhesion layer is etched more than an edge portion of an outer periphery of the reflection layer.

Accordingly, a gap is formed between an upper surface of the organic film and an edge portion of a lower surface of the reflection layer thus giving rise to a possibility that moisture enters between the reflection layer and the organic film through the gap or the anode is peeled off from the leveling film. Due to such reasons, it has been difficult for an organic luminescent display device to acquire higher definition, higher brightness and the prolongation of a product lifetime.

The present invention has been made in view of such circumstances, and it is an object of the present invention to provide an organic luminescent display device which can acquire higher definition, higher brightness and the prolongation of a product lifetime.

(1) According to one aspect of the present invention, there is provided an organic luminescent display device including: an element substrate; an organic film formed above the element substrate; and an organic electro luminescent element formed on the organic film, wherein the organic electro luminescent element includes: an anode formed on the organic film; a light emitting layer formed on the anode; and a cathode formed on the light emitting layer, and the anode includes: an adhesion layer formed in contact with an upper surface of the organic film; a reflection layer made of silver and formed in contact with an upper surface of the adhesion layer; and a light transmitting contact layer formed on the reflection layer, and an edge portion of an outer periphery of the adhesion layer is positioned outside an edge portion of an outer periphery of the reflection layer as viewed in a plan view.

(2) In the organic luminescent display device according to the present invention having the constitution (1), an edge portion of the upper surface of the adhesion layer may be positioned outside an edge portion of a lower surface of the reflection layer as viewed in a plan view.

(3) In the organic luminescent display device according to the present invention having the constitution (1), an edge portion of a lower surface of the adhesion layer may be positioned outside an edge portion of an upper surface of the adhesion layer as viewed in a plan view.

(4) In the organic luminescent display device according to the present invention having the constitution (1), an etching rate of dry etching of the adhesion layer may be smaller than an etching rate of dry etching of the reflection layer.

(5) In the organic luminescent display device according to the present invention having the constitution (1), the adhesion layer may contain at least one of titanium and titanium nitride.

(6) In the organic luminescent display device according to the present invention having the constitution (1), the adhesion layer may have the laminated structure which is constituted of a layer made of titanium and a layer made of titanium nitride.

(7) In the organic luminescent display device according to the present invention having the constitution (1), the adhesion layer may be formed of a transparent conductive film.

(8) In the organic luminescent display device according to the present invention having the constitution (1), the light transmitting contact layer may be formed of a transparent conductive film.

(9) In the organic luminescent display device according to the present invention having the constitution (1), a thin film transistor may be formed above the element substrate, and the organic film may cover the thin film transistor.

(10) In the organic luminescent display device according to the present invention having the constitution (1), the organic luminescent display device may further include a bank which is formed of an insulator and surrounds the anode, and the bank may cover the edge portion of the outer periphery of the adhesion layer.

(11) In the organic luminescent display device according to the present invention having the constitution (1), the bank may cover the edge portion of the outer periphery of the reflection layer.

(12) According to still another aspect of the present invention, there is provided an organic luminescent display device including: an element substrate; an organic film formed above the element substrate; and an organic electro luminescent element formed on the organic film, wherein the organic electro luminescent element includes: an anode formed on the organic film; a light emitting layer formed on the anode; and a cathode formed on the light emitting layer, and the anode includes: an adhesion layer formed in contact with an upper surface of the organic film; a reflection layer formed in contact with an upper surface of the adhesion layer; and a light transmitting contact layer formed on the reflection layer, and an edge portion of an outer periphery of the adhesion layer is positioned outside an edge portion of an outer periphery of the reflection layer as viewed in a plan view.

(13) In the organic luminescent display device according to the present invention having the constitution (12), an edge portion of the upper surface of the adhesion layer may be positioned outside an edge portion of a lower surface of the reflection layer as viewed in a plan view.

(14) In the organic luminescent display device according to the present invention having the constitution (12), an edge portion of a lower surface of the adhesion layer may be positioned outside an edge portion of an upper surface of the adhesion layer as viewed in a plan view.

(15) In the organic luminescent display device according to the present invention having the constitution (12), an etching rate of dry etching of the adhesion layer may be smaller than an etching rate of dry etching of the reflection layer.

(16) In the organic luminescent display device according to the present invention having the constitution (12), a thin film transistor may be formed above the element substrate, and the organic film may cover the thin film transistor.

(17) In the organic luminescent display device according to the present invention having the constitution (12), the organic luminescent display device may further include a bank which is formed of an insulator and surrounds the anode, and the bank may cover the edge portion of the outer periphery of the adhesion layer.

(18) In the organic luminescent display device according to the present invention having the constitution (12), the bank may cover the edge portion of the outer periphery of the reflection layer.

DETAILED DESCRIPTION OF THE INVENTION

Hereinafter, an organic luminescent display device 1 according to the embodiment of the present invention is explained in conjunction with drawings. Among constitutional parts which appear in the specification, parts having an identical function are given the same symbol, and one of the parts is explained and the explanation of other parts is omitted. With respect to drawings referenced in the explanation made hereinafter, there may be a case where parts which constitute technical features are described in an enlarged manner in convenience for facilitating the understanding of the technical features, and a size ratio or the like of each constitutional part is not always equal to a size ratio or the like of an actual constitutional part. Further, materials and the like of the respective constitutional parts exemplified in the explanation made hereinafter are merely examples and different materials and the like may be used. That is, the present invention can be carried out by changing the materials and the like without departing from the gist of the present invention.

Figure 1:
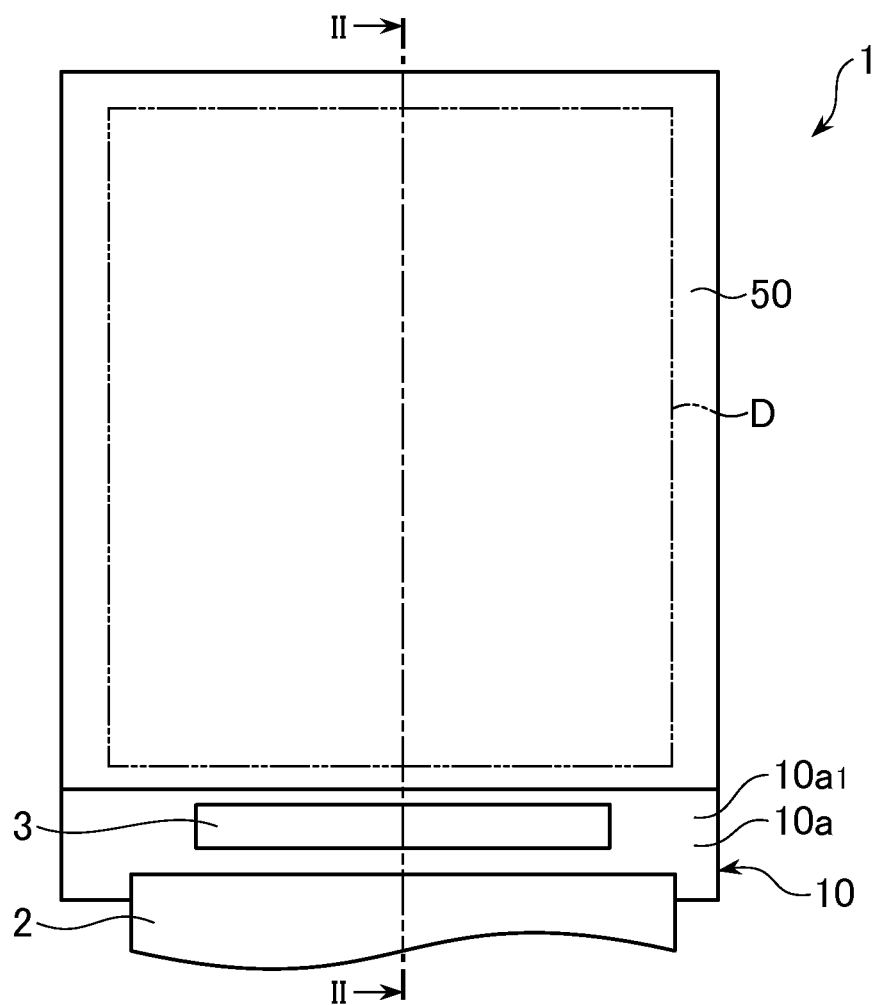
FIG. 1 is a schematic plan view of an organic luminescent display device according to one embodiment of the present invention.
Figure 2:
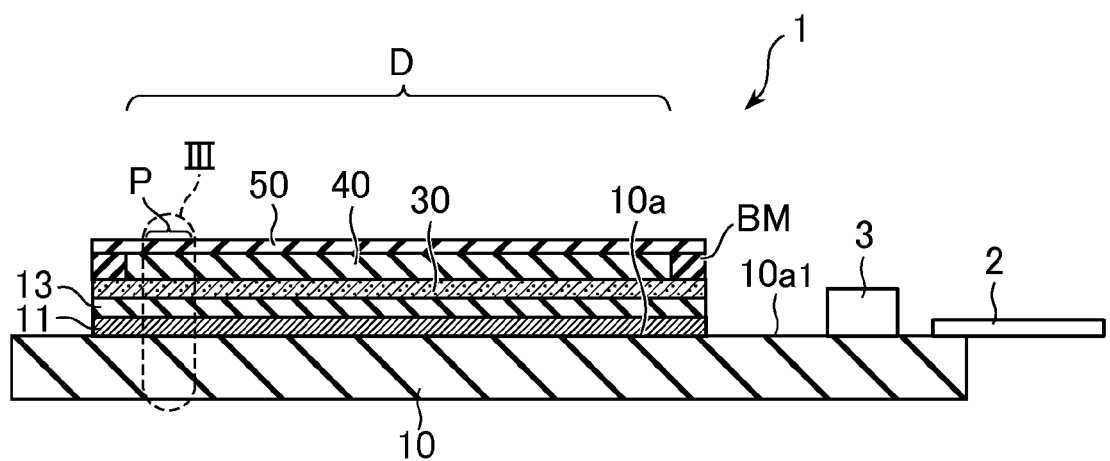
FIG. 2 is a schematic cross-sectional view of the organic luminescent display device shown in FIG. 1 taken along a line II-II.

FIG. 1 is a schematic plan view of the organic luminescent display device 1 according to one embodiment of the present invention. FIG. 2 is a schematic cross-sectional view of the organic luminescent display device 1 shown in FIG. 1 taken along a line II-II. The organic luminescent display device 1 of this embodiment includes: an element substrate 10; a flexible printed circuit board 2; a drive driver 3; an organic electro luminescent element 30 formed on the element substrate 10; a sealing film 40; and a counter substrate 50.

The element substrate 10 is a rectangular substrate on which a low-temperature polysilicon layer is formed (hereinafter, referred to as low-temperature polysilicon substrate), for example. The plurality of organic electro luminescent elements 30 are formed on an upper surface 10a of the element substrate 10. In this embodiment, low-temperature polysilicon means polysilicon formed under a temperature condition of 600° C. or below. The organic electro luminescent elements 30 are formed within a display region D having an outer periphery smaller than an outer periphery of the element substrate 10 as viewed in a plan view, for example. A black matrix BM formed of a light non-transmitting film, for example, is arranged in a region outside the display region D.

The flexible printed circuit board 2 is connected to a region $10a_1$ of the upper surface 10a of the element substrate 10 where the organic electro luminescent element 30 is not formed, and the drive driver 3 is formed in the region $10a_1$. The drive driver 3 is a driver to which image data is supplied from an external device outside the organic luminescent display device 1 through the flexible printed circuit board 2. When the image data is supplied to the drive driver 3, the drive driver 3 supplies display data to the organic electro luminescent element 30 through data lines not shown in the drawing.

Figure 3:
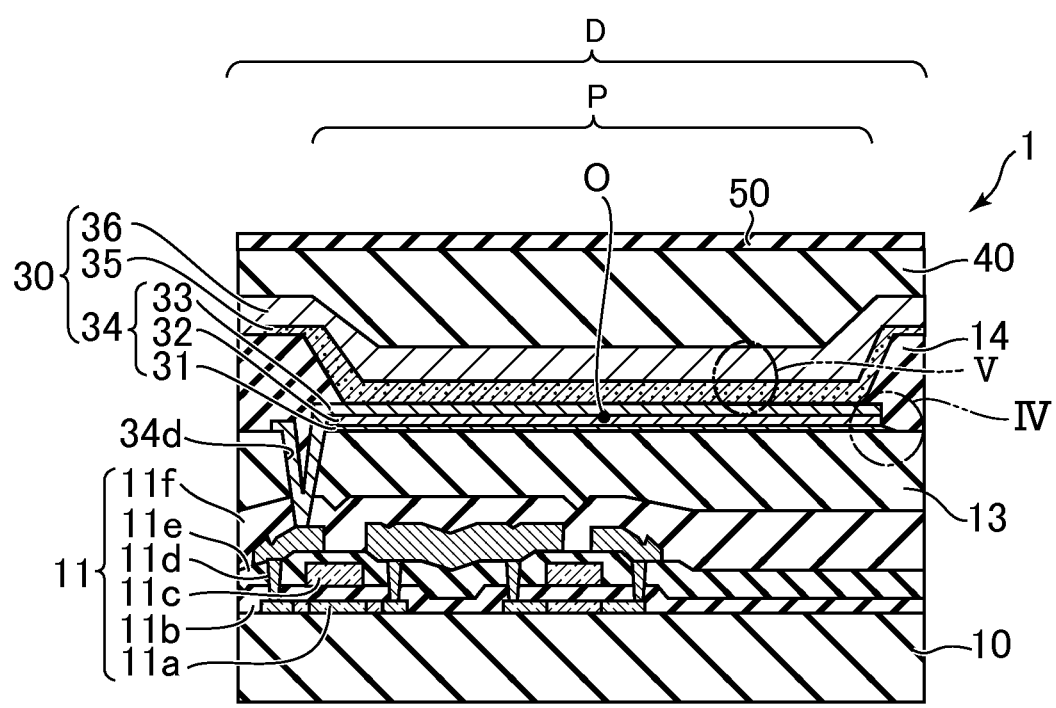
FIG. 3 is an enlarged view of a portion of a region III of the organic luminescent display device shown in FIG. 2.

Next, the constitution of the display region D of the organic luminescent display device 1 is explained in detail. FIG. 3 is an enlarged view of a portion of a region III of the organic luminescent display device 1 shown in FIG. 2. The region III is a region which corresponds to one pixel P of the display region D. In the region III, a transistor (thin film transistor) 11, an organic film (leveling film) 13 formed on the thin film transistor 11 (on the element substrate 10), the organic electro luminescent element 30, the sealing film 40 and the counter substrate 50 are laminated on the element substrate 10.

The thin film transistor 11 is a transistor for driving the organic electro luminescent element 30, and is formed on the element substrate 10 for every pixel P. The thin film transistor 11 is constituted of: a polysilicon semiconductor layer 11a; a gate insulation layer 11b; a gate line (gate electrode) 11c; a source/drain electrode 11d; a first insulation film 11e; and a second insulation film 11f, for example.

The organic film (leveling film) 13 having an insulating property is formed on the thin film transistor 11 (on the element substrate 10) so as to cover the thin film transistor 11. The leveling film 13 is made of acryl, polyimide or the like, for example. The leveling film 13 is formed on the thin film transistors 11 and hence, the thin film transistors 11 which are arranged adjacent to each other are electrically insulated from each other, and the thin film transistor 11 and the organic electro luminescent element 30 are electrically insulated from each other.

The organic electro luminescent element 30 is formed in a region on the leveling film 13 which corresponds to each pixel P. The organic electro luminescent element 30 is schematically constituted of: an anode 34 formed on the leveling film 13; an organic layer 35 formed on the anode 34 and having a light emitting layer; and a cathode 36 formed on the organic layer 35.

The anodes 34 are formed in a matrix array corresponding to the respective pixels P, and a bank 14 made of an insulator is formed between the respective anodes 34 arranged adjacent to each other. When the anode 34 is formed for every pixel P, it is preferable that the bank 14 surrounds an outer periphery of the anode 34. By forming the bank 14 in this manner, it is possible to prevent the anodes 34 arranged adjacent to each other from being brought into contact with each other. Further, by forming the bank 14 in this manner, it is possible to prevent the generation of a leakage current between the anode 34 and the cathode 36. The anode 34 is electrically connected to the thin film transistor 11 via a contact hole 34$d$ formed in the leveling film 13.

Figure 4:
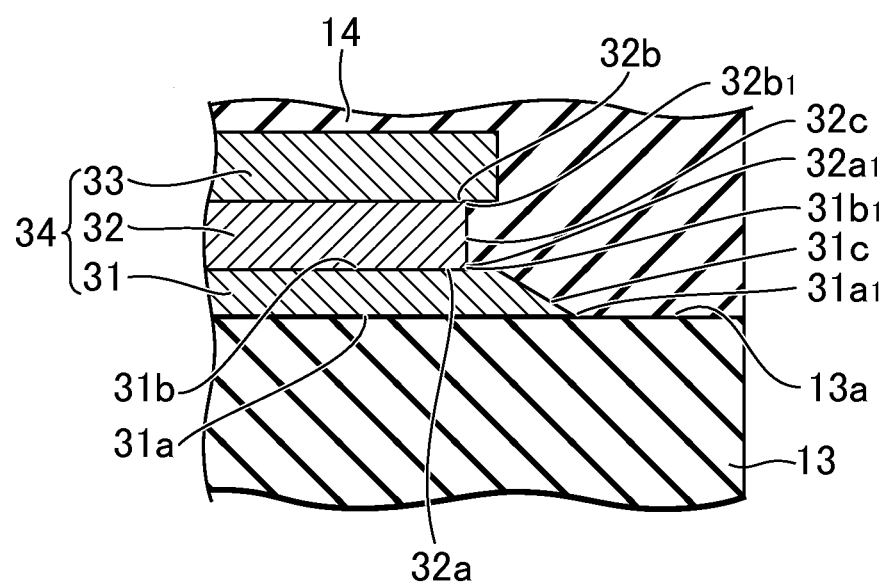
FIG. 4 is an enlarged view of a portion of a region IV of the organic luminescent display device shown in FIG. 3.

Next, the constitution of the anode 34 is explained in detail. FIG. 4 is an enlarged view of a portion of a region IV of the organic luminescent display device 1 shown in FIG. 3. The anode 34 has the laminated structure which is constituted of: an adhesion layer 31; a reflection layer 32 made of silver; and a contact layer 33. The anode 34 in this embodiment is patterned by dry etching.

The adhesion layer 31 contains at least one of titanium and titanium nitride, and a lower surface 31$a$ of the adhesion layer 31 is formed in contact with an upper surface 13$a$ of the leveling film 13. The adhesion layer 31 may be formed of a single layer film made of titanium or titanium nitride, or may have the laminated structure formed of a layer made of titanium and a layer made of titanium nitride. The adhesion layer 31 may be formed of a transparent conductive film made of ITO or IZO, for example.

The reflection layer 32 is made of silver (Ag), and a lower surface 32$a$ of the reflection layer 32 is formed in contact with an upper surface 31$b$ of the adhesion layer 31. The reflection layer 32 is provided for reflecting light emitted from the organic electro luminescent element 30 toward a sealing film 40 side.

An edge portion 31$c$ of an outer periphery of the adhesion layer 31 is positioned outside an edge portion 32$c$ of an outer periphery of the reflection layer 32 as viewed in a plan view where the anode 34 is viewed toward a leveling film 13 side from a sealing film 40 side. The edge portion 31$c$ of the outer periphery of the adhesion layer 31 in this embodiment indicates a portion ranging from an edge portion 31$a_1$ of the lower surface 31$a$ of the adhesion layer 31 to an edge portion 31$b_1$ of the upper surface 31$b$ of the adhesion layer 31. The edge portion 32$c$ of the outer periphery of the reflection layer 32 indicates a portion ranging from an edge portion 32$a_1$ of the lower surface 32$a$ of the reflection layer 32 to an edge portion 32$b_1$ of an upper surface 32$b$ of the reflection layer 32.

An etching rate of titanium, titanium nitride or the laminated structure of titanium and titanium nitride which is a material for forming the adhesion layer 31 is smaller than an etching rate of silver which is a material for forming the reflection layer 32 and a material for forming the contact layer 33. Accordingly, the adhesion layer 31 which is patterned by dry etching together with the reflection layer 32 and the contact layer 33 is formed such that the edge portion 31$c$ of the outer periphery of the adhesion layer 31 is positioned outside the edge portion 32$c$ of the outer periphery of the reflection layer 32 as viewed in a plan view.

The edge portion 31$b_1$ of the upper surface 31$b$ of the adhesion layer 31 is preferably positioned outside the edge portion 32$a_1$ of the lower surface 32$a$ of the reflection layer 32 as viewed in a plan view.

The edge portion 31$a_1$ of the lower surface 31$a$ of the adhesion layer 31 is preferably positioned outside the edge portion 31$b_1$ of the upper surface 31$b$ of the adhesion layer 31 as viewed in a plan view. That is, as shown in FIG. 4, when the anode 34 is viewed in a cross section perpendicular to the upper surface 13$a$ of the leveling film 13, a distance between the edge portion 31$c$ of the outer periphery of the adhesion layer 31 and the center of the anode 34 is preferably increased toward a lower side (edge portion 31$a_1$ side) from an upper side (edge portion 31$b_1$ side). As shown in FIG. 3, the center of the anode 34 is a point O which is the center of the anode 34 as viewed in a plan view.

The contact layer 33 is made of a transparent material having conductivity such as ITO (Indium Tin Oxide) and, as shown in FIG. 4, is formed in a state where the contact layer 33 covers the upper surface 32$b$ of the reflection layer 32.

Figure 5:
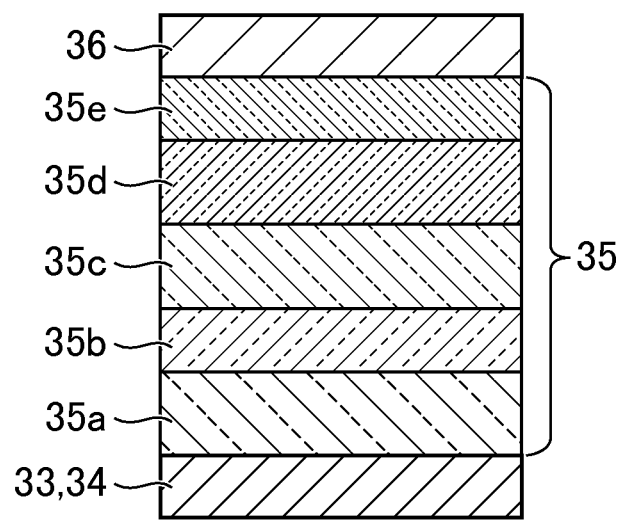
FIG. 5 is an enlarged view of a portion of a region V of the organic luminescent display device shown in FIG. 3.

FIG. 5 is an enlarged view of a portion of a region V of the organic luminescent display device 1 shown in FIG. 3. As shown in FIG. 5, the organic layer 35 having a light emitting layer is formed on the anode 34. The organic layer 35 is formed by laminating a hole injection layer 35$a$, a hole transfer layer 35$b$, a light emitting layer 35$c$, an electron transfer layer 35$d$, and an electron injection layer 35$e$ in the order from an anode 34 side, for example. The lamination structure of the organic layer 35 is not limited to the above-mentioned structure, and the laminated structure is not specified provided that the laminated structure includes at least the light emitting layer 35$c$.

The hole injection layer 35$a$ and the hole transfer layer 35$b$ have a function of transferring holes injected from the anode 34 to the light emitting layer 35$c$. The light emitting layer 35$c$ is made of an organic electroluminescent material which emits light when holes and electrons are coupled to each other. The organic layer 35 may emit a white light, or may emit lights of other colors. The electron injection layer 35$e$ and the electron transfer layer 35$d$ have a function of transferring electrons injected from the cathode 36 to the light emitting layer 35$c$.

The cathode 36 is formed in a state where the cathode 36 covers the light emitting layer 35$c$ (organic layer 35). The cathode 36 is a transparent common electrode which is brought into contact with the organic layer 35 of the plurality of organic electro luminescent elements 30 in common. The cathode 36 is made of a material having a light transmitting property and conductivity such as ITO, for example.

As shown in FIG. 3, an upper surface of the cathode 36 is covered with the sealing film 40. The sealing film 40 preferably includes a silicon nitride (SiN) layer, for example. The sealing film 40 may, however, include an SiO layer, an SiON layer, a resin layer or the like. The sealing film 40 may be formed of a single layer film made of one of these materials, or may have the laminated structure. The sealing film 40 having a silicon nitride (SiN) layer or an SiO layer has a surface whose shape traces the unevenness of a surface of a lower layer (cathode 36 in this embodiment) of the sealing film 40. Accordingly, a leveling film not shown in the drawing may be formed so as to cover the cathode 36 additionally before the sealing film 40 is formed. In this case, the surface of the sealing film 40 (surface of the sealing film 40 on a counter substrate 50 side) is leveled and hence, it is possible to suppress the generation of bubbles at the time of adhering the counter substrate 50 to the sealing film 40.

An upper surface of the sealing film 40 is covered with the counter substrate 50, for example. The counter substrate 50 is a glass substrate having an outer periphery smaller than an outer periphery of the element substrate 10 as viewed in a plan view, for example. The counter substrate 50 is formed in a state where the counter substrate 50 faces the element substrate 10 in an opposed manner with the sealing film 40 interposed therebetween. In place of the counter substrate 50, a membrane-like protective film may be formed on the sealing film 40 for protecting a surface of the sealing film 40. The counter substrate 50 may be arranged on the sealing film 40 with a filler having an insulation property interposed therebetween.

According to the organic luminescent display device 1 of the present invention, the reflection layer 32 made of silver is formed on the organic film (leveling film) 13 with the adhesion layer 31 which contains at least one of titanium and titanium nitride or the adhesion layer 31 formed of a transparent conductive film interposed therebetween, and the edge portion 31c of the outer periphery of the adhesion layer 31 is positioned outside the edge portion 32c of the outer periphery of the reflection layer 32 as viewed in a plan view. Accordingly, compared to an organic luminescent display device which does not have the above-mentioned constitution, in the organic luminescent display device of the present invention, a gap is hardly generated between the upper surface 13a of the leveling film 13 and the edge portion $32a_1$ of the lower surface 32a of the reflection layer 32. Accordingly, the intrusion of moisture between the reflection layer 32 and the leveling film 13 or peeling off of the anode 34 from the leveling film 13 can be prevented. As the result, compared to an organic luminescent display device which does not have the constitution of the present invention, the organic luminescent display device of the present invention can acquire higher definition, higher brightness and the prolongation of a product lifetime.

According to the organic luminescent display device 1 of the present invention, the edge portion $31b_1$ of the upper surface 31b of the adhesion layer 31 is positioned outside the edge portion $32a_1$ of the lower surface 32a of the reflection layer 32 as viewed in a plan view and hence, the whole surface of the lower surface 32a of the reflection layer 32 is brought into contact with the upper surface 31b of the adhesion layer 31. Accordingly, it is possible to prevent the formation of a gap between the edge portion $31b_1$ of the upper surface 31b of the adhesion layer 31 and the edge portion $32a_1$ of the lower surface 32a of the reflection layer 32. As the result, compared to an organic luminescent display device which does not have the above-mentioned constitution of the present invention, the intrusion of moisture between the adhesion layer 31 and the reflection layer 32 or peeling off of the reflection layer 32 from the adhesion layer 31 can be prevented.

Further, according to the organic luminescent display device 1 of the present invention, the edge portion $31a_1$ of the lower surface 31a of the adhesion layer 31 is positioned outside the edge portion $31b_1$ of the upper surface 31b of the adhesion layer 31 as viewed in a plan view and hence, an area where the lower surface 31a of the adhesion layer 31 is brought into contact with the upper surface 13a of the organic film 13 is larger than an area where the lower surface 32a of the reflection layer 32 is brought into contact with the upper surface 31b of the adhesion layer 31. As the result, compared to an organic luminescent display device which does not have the above-mentioned constitution of the present invention, the adhesiveness of the anode 34 to the organic film 13 is enhanced. Accordingly, the occurrence of a defect due to the peeling off of the anode 34 or the intrusion of moisture between the anode 34 and the organic film 13 can be prevented.

While there have been described what are at present considered to be certain embodiments of the invention, it will be understood that various modifications may be made thereto, and it is intended that the appended claim cover all such modifications as fall within the true spirit and scope of the invention.

What is claimed is:

1. An organic luminescent display device comprising:
   an element substrate;
   an organic film formed above the element substrate; and
   an organic electro luminescent element formed on the organic film, wherein the organic electro luminescent element includes: an anode formed on the organic film; a light emitting layer formed on the anode; and a cathode formed on the light emitting layer, and
   the anode includes: an adhesion layer formed in contact with an upper surface of the organic film; a reflection layer made of silver and formed in contact with an upper surface of the adhesion layer; and a light transmitting contact layer made of a transparent material having conductivity and formed in contact with an upper surface of the reflection layer, and
   an edge portion of an outer periphery of the adhesion layer and an edge portion of an outer periphery of the light transmitting contact layer are positioned outside an edge portion of an outer periphery of the reflection layer as viewed in a plan view.

2. The organic luminescent display device according to claim 1, wherein an edge portion of the upper surface of the adhesion layer is positioned outside an edge portion of a lower surface of the reflection layer as viewed in a plan view.

3. The organic luminescent display device according to claim 1, wherein an edge portion of a lower surface of the adhesion layer is positioned outside an edge portion of an upper surface of the adhesion layer as viewed in a plan view.

4. The organic luminescent display device according to claim 1, wherein an etching rate of dry etching of the adhesion layer is smaller than an etching rate of dry etching of the reflection layer.

5. The organic luminescent display device according to claim 1, wherein the adhesion layer contains at least one of titanium and titanium nitride.

6. The organic luminescent display device according to claim 5, wherein the adhesion layer has the laminated structure which is constituted of a layer made of titanium and a layer made of titanium nitride.

7. The organic luminescent display device according to claim 1, wherein the adhesion layer is formed of a transparent conductive film.

8. The organic luminescent display device according to claim 1, wherein the light transmitting contact layer is formed of a transparent conductive film.

9. The organic luminescent display device according to claim 1, wherein a thin film transistor is formed above the element substrate, and the organic film covers the thin film transistor.

10. The organic luminescent display device according to claim 1, further comprising a bank which is formed of an insulator and surrounds the anode, wherein the bank covers the edge portion of the outer periphery of the adhesion layer.

11. The organic luminescent display device according to claim 10, wherein the bank covers the edge portion of the outer periphery of the reflection layer.

12. An organic luminescent display device comprising:
    an element substrate;
    an organic film formed above the element substrate; and
    an organic electro luminescent element formed on the organic film, wherein the organic electro luminescent element includes: an anode formed on the organic film;

a light emitting layer formed on the anode; and a cathode formed on the light emitting layer, and the anode includes: an adhesion layer formed in contact with an upper surface of the organic film; a reflection layer formed in contact with an upper surface of the adhesion layer; and a light transmitting contact layer made of a transparent material having conductivity and formed in contact with an upper surface of the reflection layer, and an edge portion of an outer periphery of the adhesion layer and an edge portion of an outer periphery of the light transmitting contact layer are positioned outside an edge portion of an outer periphery of the reflection layer as viewed in a plan view.

13. The organic luminescent display device according to claim 12, wherein an edge portion of the upper surface of the adhesion layer is positioned outside an edge portion of a lower surface of the reflection layer as viewed in a plan view.

14. The organic luminescent display device according to claim 12, wherein an edge portion of a lower surface of the adhesion layer is positioned outside an edge portion of an upper surface of the adhesion layer as viewed in a plan view.

15. The organic luminescent display device according to claim 12, wherein an etching rate of dry etching of the adhesion layer is smaller than an etching rate of dry etching of the reflection layer.

16. The organic luminescent display device according to claim 12, wherein a thin film transistor is formed above the element substrate, and the organic film covers the thin film transistor.

17. The organic luminescent display device according to claim 12, further comprising a bank which is formed of an insulator and surrounds the anode, wherein the bank covers the edge portion of the outer periphery of the adhesion layer.

18. The organic luminescent display device according to claim 17, wherein the bank covers the edge portion of the outer periphery of the reflection layer.

* * * * *